United States Patent
Chittipeddi et al.

(12)

(10) Patent No.: US 6,556,409 B1
(45) Date of Patent: Apr. 29, 2003

(54) INTEGRATED CIRCUIT INCLUDING ESD CIRCUITS FOR A MULTI-CHIP MODULE AND A METHOD THEREFOR

(75) Inventors: Sailesh Chittipeddi, Allentown, PA (US); William Thomas Cochran, Clermont, FL (US); Yehuda Smooha, South Whitehall Township, Lehigh County, PA (US)

(73) Assignee: Agere Systems Inc., Allentown, PA (US)

( * ) Notice: Subject to any disclaimer, the term of this patent is extended or adjusted under 35 U.S.C. 154(b) by 301 days.

(21) Appl. No.: 09/652,571

(22) Filed: Aug. 31, 2000

(51) Int. Cl.[7] ................................................ H02H 3/22
(52) U.S. Cl. ........................................ 361/111; 361/56
(58) Field of Search ........................... 361/56, 104, 110, 361/111

(56) References Cited

U.S. PATENT DOCUMENTS 5,818,086 A * 10/1998 Lin et al. ..................... 257/355
5,969,929 A * 10/1999 Kleveland et al. .......... 361/111

* cited by examiner

Primary Examiner—Adolf Deneke Berhane

(57) ABSTRACT

An integrated circuit that includes I/O circuitry that may or may not be protected from ESD damage. The protection from ESD damage may be selectively deactivated or activated or may not be present at all in one or more of the I/O circuits. In use, the integrated circuit may be coupled to another integrated circuit to form a multi-chip module where the ESD protection for the I/O circuitry between the modules is deactivated or not present. This is advantageous because the likelihood of ESD damage to this I/O circuitry is reduced once the multi-chip module is formed. It is to be understood that both the foregoing general description and the following detailed description are exemplary, but are not restrictive, of the invention.

20 Claims, 5 Drawing Sheets

INTEGRATED CIRCUIT INCLUDING ESD CIRCUITS FOR A MULTI-CHIP MODULE AND A METHOD THEREFOR

FIELD OF THE INVENTION

The present invention relates generally to integrated circuits and, more particularly, to electrostatic discharge protection for multi-chip modules.

BACKGROUND OF THE INVENTION

For many years the trend in semiconductor device and package design has been toward ever-higher levels of integration, which in memory technology takes the form of integrating memory and logic on the same chip. Power modules and driver circuits are conventionally part of DRAM and SRAM devices, and many memory device designs have application specific logic embedded with the memory arrays on a common chip. However, while logic and memory semiconductor elements share many common features, there are differences. For example, a critical feature of a DRAM memory element is the storage capacitor. This element is made optimally small, and essentially without defects or leakage. Logic devices have no comparable element, and are more forgiving in many device aspects. Consequently, a wafer fabrication process that is tailored for memory device optimization is not usually optimum for logic devices. Thus, compromises are made in order to have different device species on the same semiconductor chip.

An alternative development to "integration or embedding" is the concept of "disintegration", where memory devices consist mainly of memory cells and their necessary support circuits are kept in one chip while the "application" logic and other transistors are put on another chip. These chips can be processed optimally for the size and nature of their components. In this technology, the "integration" is performed at the package level, and the key to its success is a packaging technology that produces a final product that is superior to a chip integrated system in performance and cost, and at least comparable in size. A leading candidate for this packaging technology is flip chip bonding and assembly. Flip chip bonding is a well developed technology and is characterized by bonding a bare silicon IC die upside down on an interconnect substrate such as a printed wiring board. Several bonding techniques have been developed, e.g. ball bonding, ball grid array (BGA—a form of ball bonding), and solder bump bonding. These techniques lead to relaxed I/O pitch through smaller contact surfaces, and area arrays rather than perimeter arrays for chip interconnection sites. Moreover, electrical performance is enhanced because lead lengths are reduced. Typically, the bonding method in these techniques is solder bonding.

A recent advance in multi-chip module technology is the chip-on-chip approach where an active chip is flip-chip bonded to another active chip rather than to an interconnection substrate. When the relative sizes of the chips allow, two or more small chips can be bonded to a larger chip. Logic chips, e.g. digital signal processors, are quite large with a footprint sufficient to contain at least two standard memory chips. The logic chip, i.e. the support chip, is packaged in a lead frame package thus eliminating the board or interconnection substrate of more conventional MCM packages. The intra chip interconnection circuitry in the chip-on-chip package is typically constructed on the surface of the support chip. During assembly of these packages, a need exists to protect the I/Os of the integrated circuits formed on the chips from electrostatic discharge.

The protection of integrated circuits from electrostatic discharge (ESD) has been a significant design issue, especially as transistor electrode dimensions continue to shrink. An excessively high ESD voltage conducted from a package terminal to the integrated circuit bond pad can easily damage input or output circuitry, unless protection techniques are adopted. It appears that the use of the lightly-doped drain (LDD) structures and silicided source/drain regions in integrated circuits has also increased ESD susceptibility, especially in output buffers that utilize n-channel field effect transistors. One study by C. Duvvuryand C. Diaz, "Dynamic Gate Coupling of NMOS for Efficient Output ESD Protection" Proceedings of the IRPS (1992), indicates that improved ESD performance can be obtained using a field oxide capacitor to couple the gate of the output transistor to the bond pad. In that technique, the output transistor is made to carry the ESD current. However, the field oxide capacitor undesirably increases the capacitive load on the bond-pad, requiring a larger output transistor.

A somewhat similar prior-art technique is shown in FIG. 6, where an output buffer 610 is connected to the bond pad 611. A protective n-channel transistor 613 is connected to the bond pad for conducting ESD current (I) to the power supply conductor (VSS). The ESD charge is conducted to the gate of transistor 613 by capacitor 612, typically about 10 picofarads in one design. This MOS initiated conduction allows transistor 613 to conduct by means of bipolar action during an ESD event, allowing the current I to flow. The resistor 614, typically about 2 kilohms, causes the positive charge on the gate of transistor 613 to be conducted to VSS, thereby turning transistor 613 off after the ESD event has dissipated. In this manner, transistor 613 does not conduct during normal operation of the output buffer. However, the circuitry of FIG. 6 requires that the protective transistor be sufficiently large so as to be able to carry the relatively large ESD current. This requirement increases the area to implement the output buffer. In addition, the transistor 613 presents an additional capacitive load to the buffer 610, which again undesirably requires that the buffer has additional drive capability, and hence increased size.

There are numerous alternatives for providing ESD protection. However, many of these techniques provide unsatisfactory results when used for I/O buffers. In addition, these techniques do not address ESD in the multi-chip module environment. Therefore, there is a need for an ESD protection technique that mitigates certain problems associated with the prior techniques.

SUMMARY OF THE INVENTION

The present invention is directed to an integrated circuit that includes I/O circuitry that may or may not be protected from ESD damage. The protection from ESD damage may be selectively deactivated or activated or may not be present at all in one or more of the I/O circuits. In use, the integrated circuit may be coupled to another integrated circuit to form a multi-chip module where the ESD protection for the I/O circuitry between the modules is deactivated or not present. This is advantageous because the likelihood of ESD damage to this I/O circuitry is reduced once the multi-chip module is formed. It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures.

DETAILED DESCRIPTION OF THE INVENTION

Briefly, the present invention is directed to an integrated circuit that includes I/O circuitry that may or may not be protected from ESD damage. The protection from ESD damage may be selectively deactivated or activated or may not be present at all in one or more of the I/O circuits. In use, the integrated circuit may be coupled to another integrated circuit to form a multi-chip module where the ESD protection for the I/O circuitry between the modules is deactivated or not present. This is advantageous because the likelihood of ESD damage to this I/O circuitry is reduced once the multi-chip module is formed.

Figure 1A:
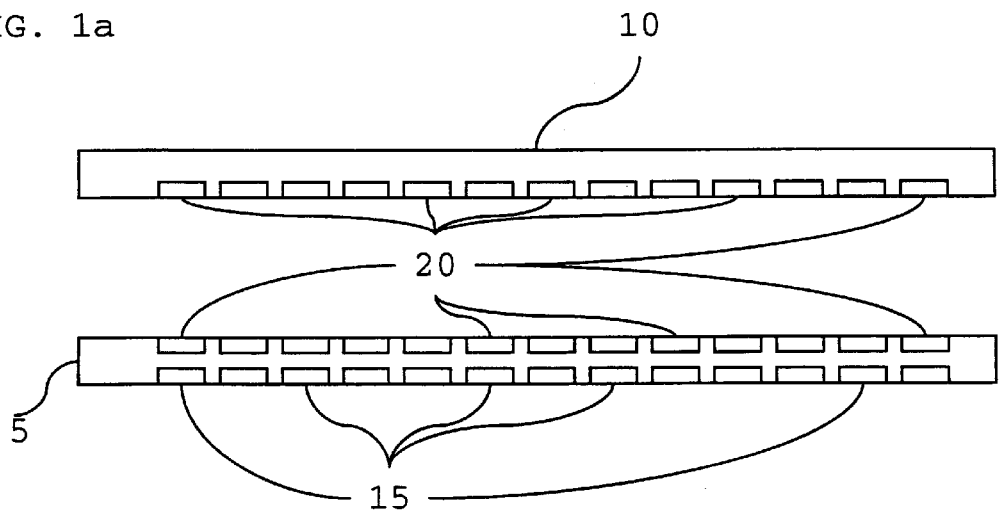
FIG. 1a is a representation of two integrated circuits according to an illustrative embodiment of the present invention.

Referring now to the drawing, wherein like reference numerals refer to like elements throughout, FIG. 1a is a representation of two integrated circuits 5 and 10 that will be coupled together via input and output (I/O) circuitry 20 to form a multi-chip module. Each of the integrated circuits 5 and 10 include I/O circuitry 15 and 20 which may in turn include electrostatic discharge (ESD) protection components to prevent damage to the integrated circuits 5 and 10. The inventors have recognized that the ESD protection components may be disabled or not provided with the I/O circuitry 20 because the potential risk from ESD damage is reduced after the integrated circuits are coupled. The risk reduction occurs because once the integrated circuits are coupled, contact between the I/O circuitry 20 via a bond pad and potential sources of ESD is reduced. The risk may be further reduced if the interface between the coupled integrated circuits is sealed with, for example, a mold or potting compound (not shown).

As a result, the ESD protection component may be eliminated from the I/O circuitry 20 or selectively disabled. In the former case, the large protective components in the ESD protection component may be eliminated. Thus, the area of the I/O circuitry 20 may be reduced. In addition, the capacitive load of the ESD protection component may be avoided. In the case where the ESD protection component may be selectively disabled, the I/O circuitry 20 may be protected prior to assembly of the multi-chip module. Once the multi-chip module is assembled, the ESD component of the I/O circuitry 20 may be selectively disabled. As a result, the capacitive load for the I/O circuitry 20 may be reduced during operation of the integrated circuits 5 and 10. In either case, the reduction in the capacitive load allows the I/O circuitry to operate at a reduced drive level or at a higher speed or both, as compared to a typical I/O circuit having an operational ESD component.

Figure 1B:
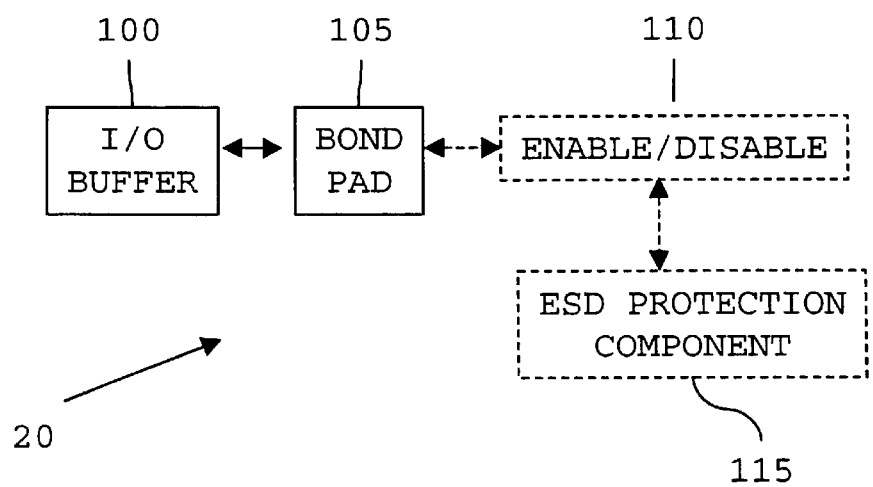
FIG. 1b is a block diagram of an input/output (I/O) circuit according to an illustrative embodiment of the present invention.

FIG. 1b is an illustrative embodiment of the I/O circuitry 20 shown in FIG. 1a. The I/O circuitry 20 includes an I/O buffer 100 coupled to a bond pad 105. The I/O buffer may be a conventional I/O buffer used to transmit and receive signals via the bond pad. Alternatively, the I/O buffer 100 may only be adapted to transmit or receive data. In this illustrative embodiment, the I/O circuitry does not include an ESD component because the likelihood of ESD damage is reduced when the integrated circuits 5 and 10 are coupled. Prior to coupling of the integrated circuits, special handling of the integrated circuits may be necessary to avoid damage to the unprotected I/O circuitry 20.

In an alternative embodiment, the I/O circuitry 20 may also include an ESD protection component 115 coupled to the bond pad 105 via an enable/disable component 110. The enable/disable component 110 operates to electrically couple the bond pad 105 to the ESD protection component 115. The enable/disable component 110 may be a fusible link that provides an electrical interconnection between the bond pad 105 and the ESD protection component 115. The ESD protection component 115 provides ESD protection to the integrated circuit in which it is located. The fuse may be severed by laser or a large current or other well known technique. The manufacture and use of fusible links in integrated circuits are well known and, therefore, are not described in further detail herein. Such conventional fused links are suitable for use in the illustrative embodiment of the present invention. The fuse may be severed before or after the integrated circuits are coupled to form a multi-chip module. As a result, the capacitive and resistive load of the ESD protection component 115 may not impact the I/O buffer during operation.

Figure 1C:
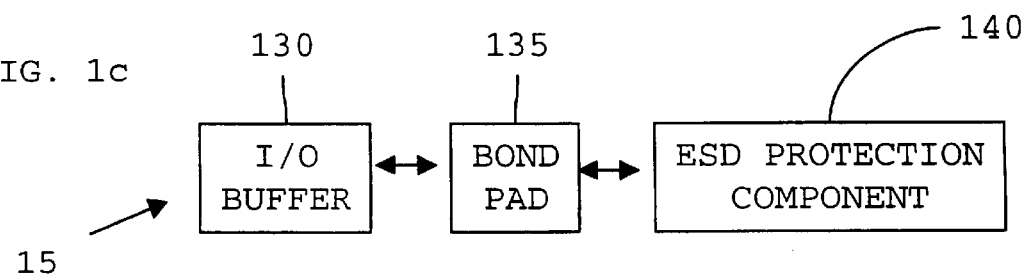
FIG. 1c is a block diagram of an I/O circuit.

The integrated circuit 5 also includes I/O circuitry 15 to protect the assembled multi-chip module from damage. As is shown in FIG. 1c, the I/O circuitry 15 includes an I/O buffer 130 coupled to a bond pad 135 which is in turn coupled to an ESD protection component 140. Each of these components many be the same as the components of the I/O circuitry 20 except that the enable/disable component 110 is eliminated. Alternatively, the I/O circuitry 15 may be any one of a number of conventional I/O circuitry that include ESD components, buffers, and bond pads.

Figure 2A:
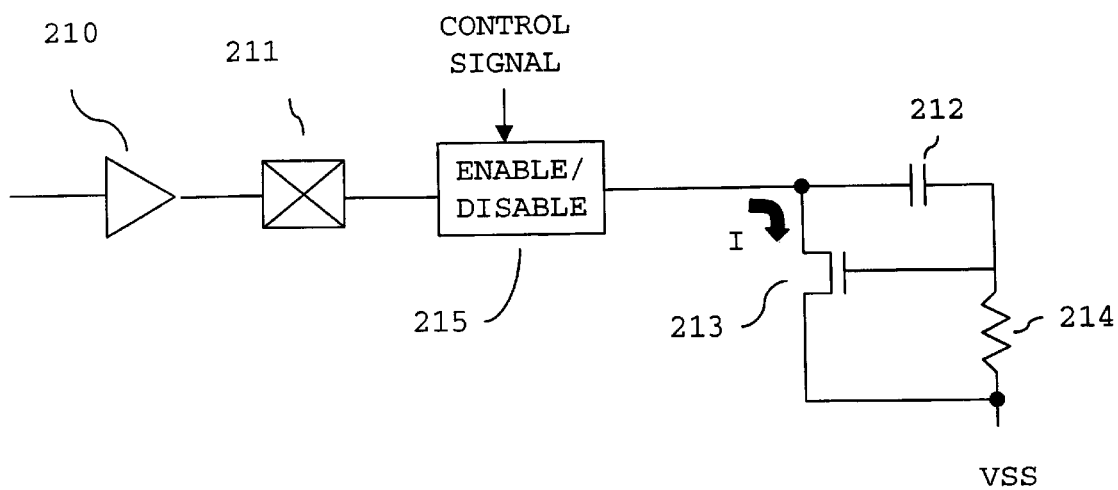
FIG. 2a is a block diagram of another I/O circuit according to an illustrative embodiment of the present invention.

FIG. 2a illustrates an alternative embodiment of the I/O circuitry. In this embodiment a protective n-channel transistor 213 is connected to the bond pad 211 via enable/disable circuitry 215 to conduct ESD current (I) to the power supply conductor (VSS). The ESD voltage is conducted to the gate of transistor 213 by capacitor 212, typically about 10 picofarads. This conduction allows transistor 213 to conduct and trigger a bipolar action during an ESD event, allowing the discharge current I to flow. The resistor 214, typically about 2 kilohms, causes the positive charge on the gate of transistor 213 to be conducted to VSS, thereby turning transistor 213 off after the bipolar action been activated. This protects the buffer 210 as well as other circuitry within the integrated circuit, including the MOS device itself.

The enable/disable circuitry 215 electrically decouples the ESD protection component from the bond pad 211 in response to a control signal. The enable/disable circuitry 215 may be a fusible link that is blown in response to the control signal. Thus, permanently isolating the ESD protection component from the bond pad 211. Alternatively, the enable/disable circuitry may include circuitry to isolate the ESD protection circuit in response to the control signal. For example, the enable/disable circuitry 215 may be a switch or switch network for electrically coupling and decoupling the ESD component from the bond pad 215. In this case, the switch or switch network is implemented so that when no power is applied to the integrated circuit, the integrated circuit is protected from ESD damage. In other words, the ESD protection device is connected to the bond pad 211 when power is not applied to the integrated circuit.

In another alternative embodiment, the enable/disable component 215 may electrically isolate the ESD protection component in response to a specified condition. The conditions include power up of the integrated circuit, the interconnection of the integrated circuits to form the multi-chip module, testing, burn in, etc. For example, when the integrated circuit is powered, the control signal may be activated to cause the enable/disable component 215 to electrically isolate the bond pad 211 from the ESD component. The control signal may also be generated in response to external inputs to the integrated circuit or a specified testing procedure. The condition may be selected to enable ESD protection of the integrated circuit at certain times and to disable the ESD protection at another time. For example, the condition may be the assembly of the multi-chip module where the ESD protection is enabled prior to assembly and disabled after assembly.

Figure 2B:
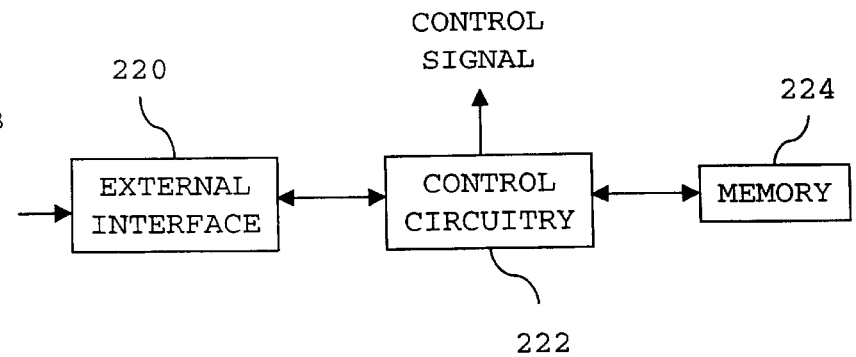
FIG. 2b is a block diagram of the components to produce a control signal according to an illustrative embodiment of the present invention.

FIG. 2b illustrates one embodiment for generating the control signal where the circuitry shown in FIG. 2b is located in an integrated circuit that contains the I/O circuitry 20. In this embodiment, an external input signal is provided to the integrated circuit via the external interface 220 such as a JTAG interface. The input signal may be provided during burn in or testing of the integrated circuits 5 and 10. Alternatively, control circuitry 222 may initiate the process to generate the control signal upon power up of the integrated circuit. In either case, the control circuitry may access a memory 224 to determine which one or ones of the ESD protection components are to be disabled. In response, control signals are generated to disable the appropriate ESD protection circuits.

Figure 3:
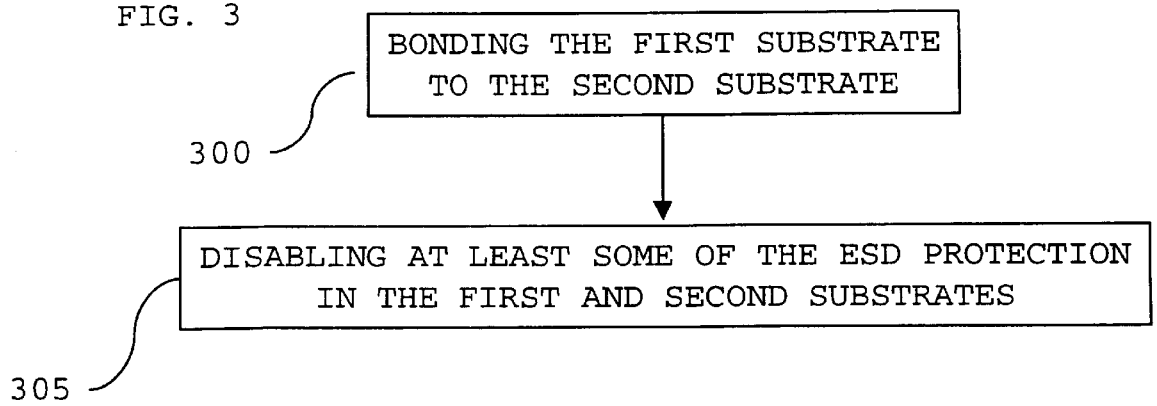
FIG. 3 is a flow chart diagram useful for described a further illustrative embodiment of the present invention.
Figure 4:
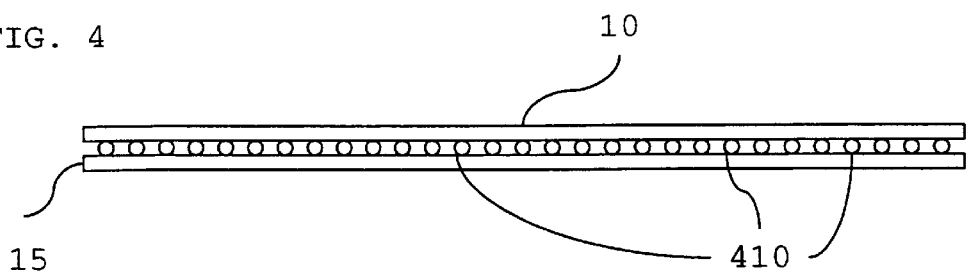
FIG. 4 is a representation of multi-chip module according to an illustrative embodiment of the present invention.

FIG. 3 illustrates a process for forming the multi-chip module according to an illustrative embodiment of the present invention. At step 300, the first integrated circuit 5 is bonded to the second integrated circuit 10. The coupled integrated circuits are shown in FIG. 4. The integrated circuits are coupled using solder balls 410 forming a ball grid array. A process for coupling the integrated circuits is shown in U.S. Pat. No. 5,898,223 entitled CHIP-ON-CHIP IC Packages issued to Frye et al. This patent is incorporated herein by reference. Next, at step 305, at least some of the ESD protection components for the first and second integrated circuits are disabled. As a result, the I/O circuitry between the integrated circuits 5 and 10 may operate at increased speeds or at higher drive levels or both.

Figure 5:
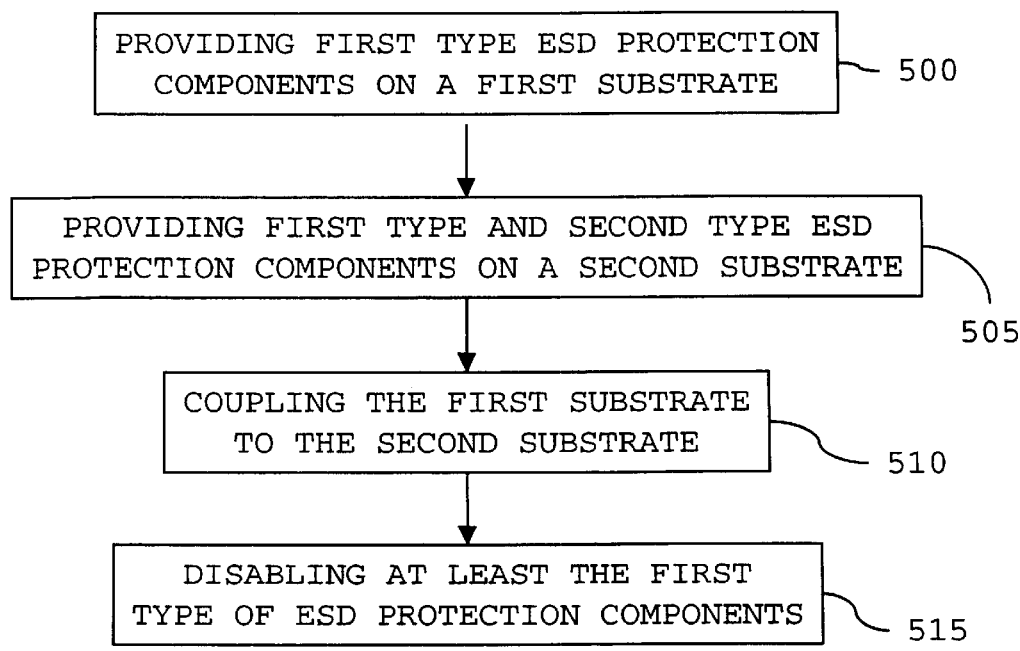
FIG. 5 is a flow chart diagram useful for describing another illustrative embodiment of the present invention.
Figure 6:
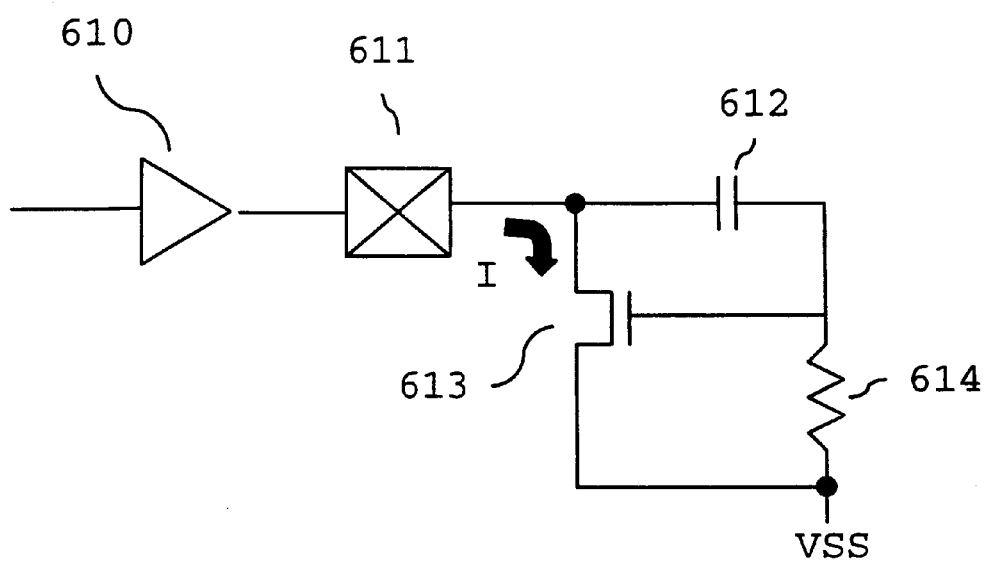
FIG. 6 is a block diagram of an I/O circuit according to the prior art.

FIG. 5 illustrates a further illustrative process for forming the multi-chip module. At step 500, a first integrated circuit is provided with ESD protection components of a first type. At step 505, first and second type ESD protection components are provided on a second integrated circuit. The first type of ESD protection components are, for example, shown in FIG. 1b. The second type of ESD protection components are, for example, shown in FIG. 1c. At step 510, the first and second integrated circuits are coupled together to form the multi-chip module. Then, at step 515, at least one of the first type of ESD protection components is disabled. In other words, the ESD component is isolated so the effect of the capacitance and resistance of the ESD component on the I/O circuitry is reduced.

While the illustrative embodiments have been described herein with reference to two integrated circuits, one or more than integrated circuits may be provided with the I/O circuitry shown in FIG. 1. In addition, while certain ESD circuitry and buffers have been described with reference to illustrative embodiments, these components should not be limited to the disclosed embodiments. Further, although the invention has been described with reference to exemplary embodiments, it is not limited to those embodiments. Rather, the appended claims should be construed to include other variants and embodiments of the invention that may be made by those skilled in the art without departing from the true spirit and scope of the present invention.

What is claimed:

1. A device comprising:
   a first electrostatic discharge (ESD) protection circuit configured to protect a first input/output circuit of said device, wherein said first input/output circuit is configured to couple said device to a second device;
   a second ESD protection circuit configured to protect a second input/output circuit of said device; and
   circuitry adapted to selectively enable and disable said first ESD protection circuit.

2. The device of claim 1 wherein said first input/output circuit is configured to couple said device to said second device by employing solder bonding.

3. The device of claim 1 wherein said first input/output circuit is selectively disabled after coupled to said second device.

4. The device of claim 1 further comprising:
   a buffer; and
   a bond pad electrically coupled to said buffer and selectively electrically coupled to said first ESD protection circuit, wherein said first ESD protection circuit is selectively disabled by electrically isolating said first ESD protection circuit from said bond pad.

5. The device of claim 1 wherein said first ESD protection circuit includes a switch.

6. The device of claim 1 further comprising an external interface and a memory coupled to said circuitry.

7. The device of claim 1 wherein said device is an integrated circuit.

8. A method of manufacturing a device, comprising:
   providing a first electrostatic discharge (ESD) protection circuit configured to protect a first input/output circuit of said device, wherein said first input/output circuit is configured to couple said device to a second device;
   providing a second ESD protection circuit configured to protect a second input/output circuit of said device; and
   coupling circuitry to said first input/output device, wherein said circuitry is configured to selectively enable and disable said first ESD protection circuit.

9. The method of claim 8 wherein said first input/output circuit is configured to couple said device to said second device by employing solder bonding.

10. The method of claim 8 wherein said first input/output circuit is selectively disabled after coupled to said second device.

11. The method of claim 8 further comprising:

electrically coupling a bond pad to a buffer; and selectively coupling said first ESD protection circuit electrically to said bond pad, wherein said first ESD protection circuit is selectively disabled by electrically isolating said first ESD protection circuit from said bond pad.

12. The method of claim 8 further comprising including a switch in said first ESD protection circuit.

13. The method of claim 8 further comprising coupling an external interface and a memory to said circuitry.

14. The method of claim 8 wherein said device is an integrated circuit.

15. A multi-chip module comprising:

a first integrated circuit; and a second integrated circuit, including:

a first electrostatic discharge (ESD) protection circuit configured to protect a first input/output circuit of said second integrated circuit, wherein said first input/output circuit is configured to couple said second integrated circuit to said first integrated circuit;

a second ESD protection circuit configured to protect a second input/output circuit of said second integrated circuit; and circuitry adapted to selectively enable and disable said first ESD protection circuit.

16. The multi-chip module of claim 15 wherein said first input/output circuit is configured to couple said second integrated circuit to said first integrated circuit by employing solder bonding.

17. The multi-chip module of claim 15 wherein said first input/output circuit is selectively disabled after said second integrated circuit is coupled to said first integrated circuit.

18. The multi-chip module of claim 15 wherein said second integrated circuit further includes:

a buffer; and a bond pad electrically coupled to said buffer and selectively electrically coupled to said first ESD protection circuit, wherein said first ESD protection circuit is selectively disabled by electrically isolating said first ESD protection circuit from said bond pad.

19. The multi-chip module of claim 15 wherein said first ESD protection circuit includes a switch.

20. The multi-chip module of claim 15 wherein said second ESD protection circuit protects said multi-chip module.

* * * * *